(12) United States Patent
Dimaano, Jr. et al.

(10) Patent No.: US 6,543,127 B1
(45) Date of Patent: Apr. 8, 2003

(54) COPLANARITY INSPECTION AT THE SINGULATION PROCESS

(75) Inventors: Antonio B. Dimaano, Jr., Singapore (SG); Weddie Pacio Aquien, Singapore (SG); John Briar, Singapore (SG)

(73) Assignee: St Assembly Test Service Ltd., Singapore (SG)

( * ) Notice: Subject to any disclaimer, the term of this patent is extended or adjusted under 35 U.S.C. 154(b) by 295 days.

(21) Appl. No.: 09/614,011

(22) Filed: Jul. 11, 2000

(51) Int. Cl.[7] .................................................. H05K 3/30
(52) U.S. Cl. .......................... 29/841; 29/740; 29/566.1
(58) Field of Search ................................ 29/592.1, 593, 29/827, 830, 832, 833, 839, 840, 841, 739, 740, 754, 566.1, 566.3

(56) References Cited

U.S. PATENT DOCUMENTS

| | | | |
|---|---|---|---|
| 4,754,555 A | 7/1988 | Stillman | 33/533 |
| 5,465,152 A | 11/1995 | Bilodeau et al. | 356/371 |
| 5,843,808 A | 12/1998 | Karnezos | 438/121 |

*Primary Examiner*—Edward K. Look
*Assistant Examiner*—Michael Leslie
(74) *Attorney, Agent, or Firm*—George O. Saile; Stephen B. Ackerman

(57) ABSTRACT

In accordance with the objectives of the invention a new method and apparatus is provide for assuring contact balls coplanarity. The process and apparatus for coplanarity inspection is integrated with the current processing step of BGA device singulation and pick-and-place, thereby eliminating the need for a separate processing step that is typically required for the coplanarity inspection.

14 Claims, 5 Drawing Sheets

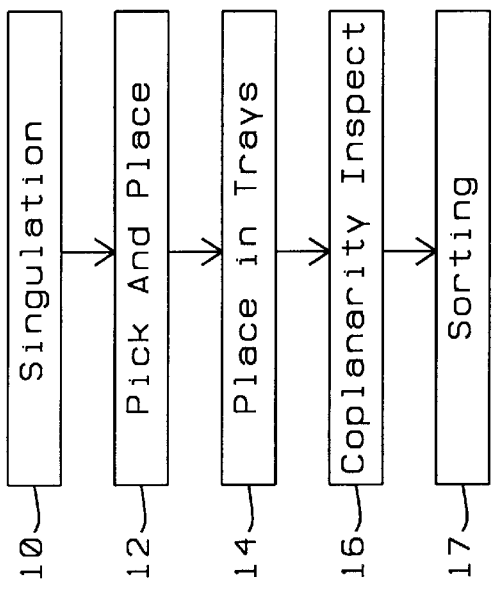
FIG. 1 – Prior Art
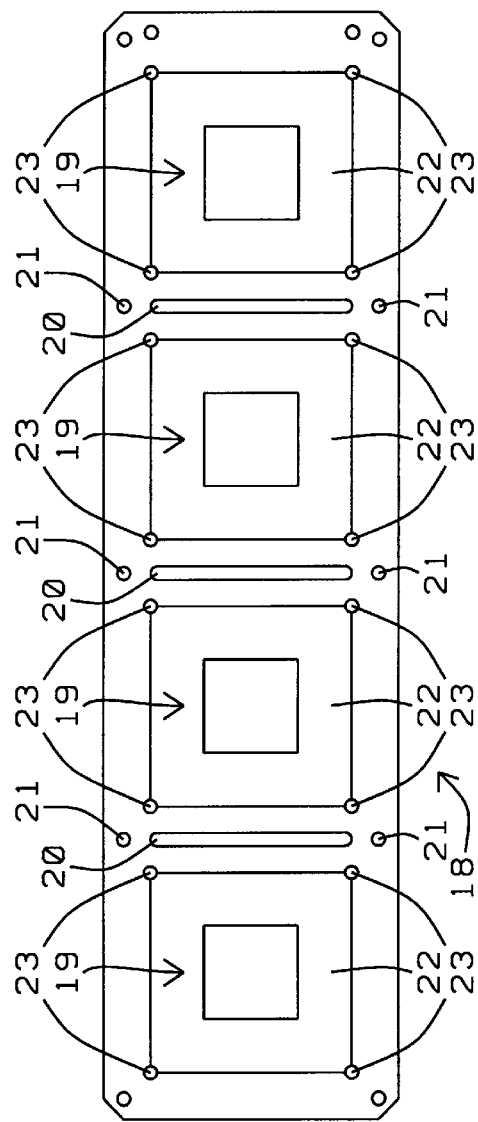
FIG. 2 – Prior Art

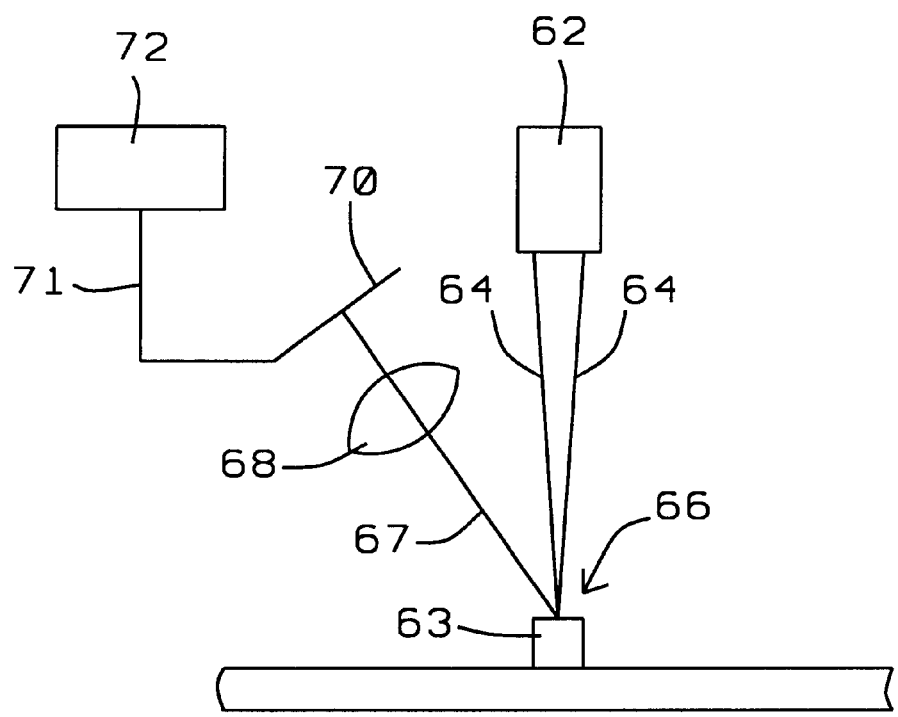
FIG. 6 – Prior Art

COPLANARITY INSPECTION AT THE SINGULATION PROCESS

BACKGROUND OF THE INVENTION (1) Field of the Invention

The invention relates to the fabrication of integrated circuit devices, and more particularly, to a method for inspection of contact balls coplanarity of singulated device packages whereby contact ball coplanarity inspection is performed immediately after and as part of device singulation and the device pick-and-place processing sequence.

(2) Description of the Prior Art

One of the results of increased circuit packaging density has over the years been the development of methods that provide an increased number of input and output (I/O) points that can be used for the interconnection of semiconductor devices. These devices are divided into a number of classes dependent on the method that is used to provide the increased I/O count, the best known classes within these are the Ball Grid Array (BGA) devices and the Column Grid Array (CGA) devices. A Ball Grid Array (BGA) is an array of solderable balls placed on a chip carrier. The balls contact a printed circuit board in an array configuration where, after reheat, the balls connect the chip to the printed circuit board. BGA's are known with 40, 50 and 60 mils. spacings in regular and staggered array patterns.

In general, Chip on board (COB) techniques are used to attach semiconductor dice to a printed circuit board, thereby including flip chip attachment, wirebonding, and tape automated bonding (TAB). Flip chip attachment consists of attaching a flip chip to a printed circuit board or other substrate. A flip chip is a semiconductor chip that has a pattern or arrays of terminals spaced around an active surface of the flip chip for face down mounting of the flip chip to a substrate.

Generally, the flip chip active surface has one of the following electrical connectors: BGA (wherein an array of minute solder balls is disposed on the surface of the flip chip that attaches to the substrate); Slightly Larger than Integrated Circuit Carrier (SLICC) (which is similar to the BGA but having a smaller solder ball pitch and diameter than the BGA); a Pin Grid Array (PGA) (wherein an array of small pins extends substantially perpendicularly from the attachment surface of a flip chip, such that the pins conform to a specific arrangement on a printed circuit board or other substrate for attachment thereto. With the BGA or SLICC, the solder or other conductive ball arrangement on the flip chip must be a mirror image of the connecting bond pads on the printed circuit board so that precise connection can be made. The flip chip is bonded to the printed circuit board by refluxing the solder balls. The solder balls may also be replaced with a conductive polymer. With the PGA, the pin arrangement of the flip chip must be a mirror image of the recesses on the printed circuit board. After insertion, the flip chip is generally bonded by soldering the pins into place.

In order to assure reliable soldering of the contact balls to a Printed Circuit Board, the planarity of the points of contact of the contact balls with the PCB must be inspected. These points of contact of the contact balls must essentially form in one plane so that the device can be surface mounted on a PCB by soldering the contact balls to the contact pads that are provided for this purpose in the surface of the PCB. It is known that a planar surface is determined by three points, it therefore follows that generally only three balls of the contact ball array need to contact the underlying surface of the PCB in order to establish contact with this surface. Device packaging reliability requires that the points of contact between a BGA device and the surface of the PCB on which the BGA device is mounted must not be limited to only three points of contact but must be extended such that all contact points of the contact balls rest on the surface of the PCB prior to flowing the contact balls with the contact pads on the surface of the PCB. To assure this planarity of contact points of the contact ball, the device can be manually inspected by placing the device on a smooth surface after which any lack of contact between the contact points of the contact balls and the smooth surface can be readily identified. The characteristic that reflects the planarity of the contact points of the contact balls is the coplanarity of the contact balls which is a measure of the closeness of the contact points of the contact balls to the underlying surface. Good coplanarity is required in order to provide reliable and low resistivity contact between the contact ball of the BGA device and the underlying PCB.

Coplanarity measurements must be made with a degree of accuracy and therefore typically require the use of optical techniques. Most frequently measured in this manner are surface height of the contact points of the contact balls as a function of the geometric location of the contact ball within the array of contact balls. BGA array devices are typically formed using a processing environment that creates multiple BGA devices as sub-assemblies which are, after the BGA device creation is completed, separated or singulated into individual BGA devices. These individual BGA devices are further packaged to form the more complex semiconductor device package. Inspection of contact ball coplanarity typically takes place after the singulation of the devices has been completed thus adding the time that is required for the coplanarity inspection to the processing time of the BGA device. This sequence of device singulation followed by coplanarity inspection therefore has a device throughput that is lower than the device throughput that can be obtained if the inspection for coplanarity can be removed from this processing cycle. The process of the invention provides such a method and, in doing so, increase device throughput for BGA type devices.

U.S. Pat. No. 5,465,152 (Bilodeau) shows a coplanarity inspection method.

U.S. Pat. No. 5,843,808 (Karnezos) teaches a method for automated assembly of packages including singulation. However, this reference differs from the invention.

U.S. Pat. No. 4,754,555 (Stillman) shows a coplanarity inspection method.

SUMMARY OF THE INVENTION

A principle objective of the invention is to improve Ball Grid Array device throughput by providing a method of assuring contact ball coplanarity that does not delay or impact device throughput.

In accordance with the objectives of the invention a new method is provided for assuring contact balls coplanarity. The process of coplanarity inspection is integrated with the current processing step of BGA device singulation, thereby eliminating the need for a separate processing step that is typically required for the coplanarity inspection.

BRIEF aDESCRIPTION OF THE DRAWINGS

FIG. 1 shows a flow of the current processing sequence of BGA device singulation followed by BGA contact ball coplanarity inspection.

FIG. 2 shows a top view of a strip of BGA devices prior to singulation of the BGA devices.

FIG. 6 shows a cross section of the ball inspection optical arrangement.

DESCRIPTION OF THE PREFERRED EMBODIMENTS

Figure 3:
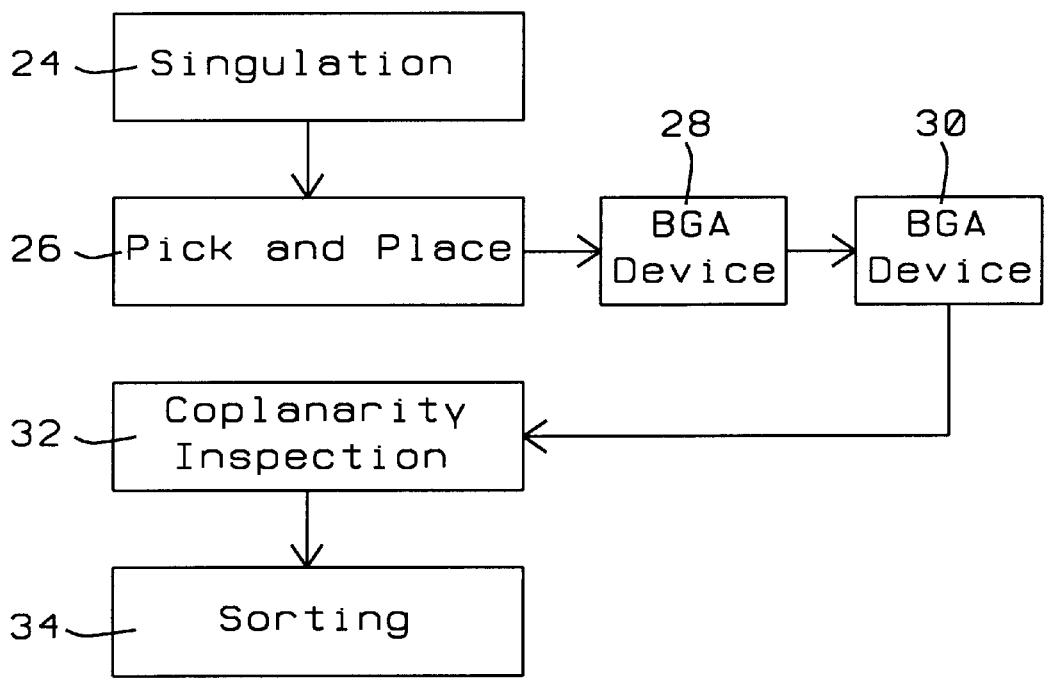
FIG. 3 shows a flow of the process of the invention of first inspecting the contact points of the contact balls for coplanarity after which the BGA devices are singulated.

Referring now specifically to FIG. 1, there is shown the currently used processing sequence of singulating strips of BGA devices in to individual devices. This operation is operation 10 of punching a BGA device strip that typically contains six BGA devices into individual BGA devices. After the individual BGA devices have been separated from the device strip the individual devices are selected, the pick and place operation 12, using a vacuum suction (not shown in FIG. 1) and placed into device trays 14. The trays containing the singulated devices are then moved to a separate inspection station 16 where contact ball coplanarity is measured using optical methods of measurement. The current method therefore uses two separate operations of first singulating the device strips into individual devices after which the singulated devices are evaluated for coplanarity.

The processing sequence that is presently used can be detailed as follows:

die attach (to the die transportation strip)

wire bond to connect the die to metal traces that are contained in the die transportation strip encapsulation of the die in a protective molding marking of the die for production control purposes attachment of a contact balls to the die singulation of the die by separating the die from the die transportation strip, and performing outgoing inspection of the singulated die in order to determine contact ball coplanarity.

FIG. 2 shows a strip 18 of BGA devices before these devices have been singulated (or separated) from the device strip 18 into individual substrates 22. Stress relieve openings or slots 20 have been provided in the device strip 18 between each location where a BGA type device is positioned. A total of four substrates 22 are shown on the device strip 18 where BGA type devices 19 reside prior to the singulation of the devices. Each substrate 22 is singulated from the device strip 18 individually and one at a time. To perform the step of device singulation the device strip 18 is moved forward in a step-and-stop motion, such that the BGA type device that needs to be singulated is aligned with the singulation tool (not shown in FIG. 2) after which the operation of singulation is performed. Tooling holes 21 are provided in the device substrate strip 18 in order to enable strip positioning and movement. These tooling holes 21 are further used during subsequent processing steps that are applied to the device substrate strip 18 such as device molding, whereby the device 19 is embedded in a molding compound for device protection. At the corners of each substrate 22 have been created separation openings 23, which prevent extreme stress in the corners of the substrates 22 during the singulation process and, in so doing, allow for damage free singulation of the substrates 22. The substrates 22 are provided (on the upper and on the lower surface) with contact pads and can contain one or more layers of interconnect lines in one or more layers of metal that form the structure of substrate 22.

FIG. 3 shows the flow of the steps of measurement of coplanarity and device singulation of the invention. The operation of the process of the invention starts with singulation or punching 24 of the BGA devices thereby separating the BGA device 26 from the device transportation strip. The singulated devices are moved through a buffer stage that, as shown in FIG. 3, contains two singulated BGA devices 28 and 30, the singulated devices are, using vacuum pick and place technology, moved from position 26 to position 28 to position 30 after which the BGA type device is moved, still using vacuum pick and place technology, into position 32 where the ball coplanarity is inspected or measured.

It must be noted in FIG. 3 that the process of the invention eliminates the need of collecting the singulated devices in trays for inspection of the contact ball coplanarity. Using the process of the invention, the singulated devices are moved, under machine or auto automatic control (vacuum pick and place technology) from the singulation step to the coplanarity evaluation step.

The justification for the method of the invention rests on cost reduction that can be obtained by the implementation of the invention. The headcount of the number of operators that is required for the process of the invention is one operator less than conventional methods of coplanarity inspection. This is because the Coplanarity Inspection is combined with the Singulation Process, thereby eliminating the outgoing coplanarity inspection. In addition, one less tool is required as a result of the process of the invention. Furthermore, the cycle time for the process is reduced due to the new processing sequence, resulting in increased machine throughput and the therefrom following reduction of processing costs.

The processing sequence of Prior Art and the processing sequence under the process of the invention can be compared as follows, see FIG. 1 (Prior Art) and FIG. 3 (the process of the invention).

For the Prior Art process (see FIG. 1) the sequence was as follows:

singulation pick and place place the units in a transportation tray perform coplanarity inspection perform sorting.

The first three steps of this sequence were performed by one operator, the fourth and fifth step was performed by an additional operator.

For the process of the invention, see FIG. 3, the processing steps are as follows:

singulation pick and place perform coplanarity inspection, and perform sorting.

All of the operations of the process of the invention are performed by one operator and at one location thus resulting in the indicated cost savings.

Coplanarity has already been defined as the distance between the tip of the contact ball (the contact point of the contact ball) and a plane of reference more commonly referred to as the seating plane. Coplanarity can be measured not only against a (flat) plane but can also be measured against other geometric surfaces such as parabolic, elliptical, and other type surfaces. The most frequently used method of determining coplanarity is the method of least mean square regression analysis whereby a "best fit" surface of the contact points of the contact balls is determined. It is clear that in an actual manufacturing environment it is the objective to have all contact points of the contact balls reside in one (flat) surface. Since actual distribution of the plane in which the contact points of the contact balls reside most likely deviates from the ideal flat plane situation, the square regression analysis allows for the creation of a non-planar surface that better reflects actual distribution of the contact points of the contact balls and that therefore can more readily be used for process control that is aimed at correcting the actual distribution.

After the BGA device has been measured for coplanarity, a sorting operation 34 separates the evaluated devices into separate categories as determined by the results that have been obtained during operation 32 of measuring the device coplanarity. This allows for a quality control type of inspection whereby limits can be implemented that are indicative of the coplanarity of the BGA devices and therefore of the expected or predicted reliability and electrical performance of the devices. This than is similar to for instance a ohmic resistance measurement or a measurement of any other performance parameter that allows to classify certain devices as acceptable while other devices may be rejected or may be reworked.

The process of the invention makes use of so called "nests" which are specially designed holding units into which each BGA device is deposited at each of the intermittent points 26, 28, and 30 while the BGA device is in the processing buffer that is made up of these processing points. The location of the various nests is therefore fixed and present within the device buffer regions 28 and 30 and in the location 32 where the device is measured for coplanarity.

The processing sequence of the process of the invention is as follows:

die attach (to the die transportation strip)

wire bond to connect the die to metal traces that are contained in the die transportation strip encapsulation of the die in a protective molding marking of the die for production control purposes attachment of a contact balls to the die singulation of the die by separating the die from the die transportation strip transporting the singulated die through a buffer zone, and measuring ball coplanarity.

The elimination of the moving of singulated die (for coplanarity measurement at a special station) and the replacement of this step by an (automatically) controlled process of coplanarity measurement results in a time saving of the overall processing of the BGA die and, as a consequence, in a reduction of the costs incurred during processing of BGA devices.

Figure 4:
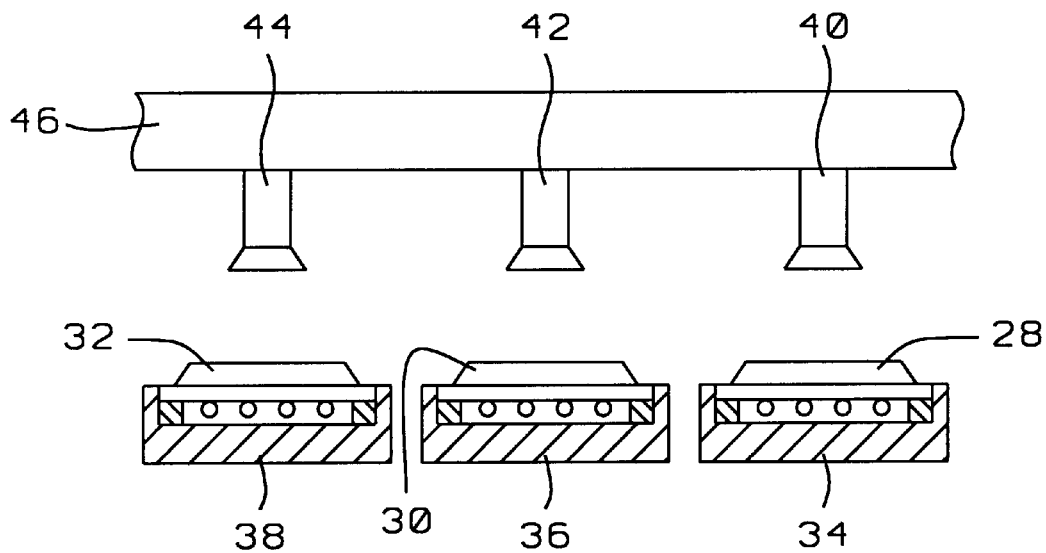
FIG. 4 shows movement of BGA devices through the buffer stage of the processing sequence.

FIG. 4 shows the buffer stage of the process of the invention where individual BGA die 28, 30 and 32 have been positioned into their respective die "nests" 34, 36 and 38 by the vacuum pick and place suction cups 40, 42 and 44. A vacuum 46 is provided to the suction cups 40, 42 and 44 for this purpose. The die are moved in the sequence from position 28 to position 30 to position 32 where this latter position is the position where the contact ball coplanarity is measured.

Figure 5A:
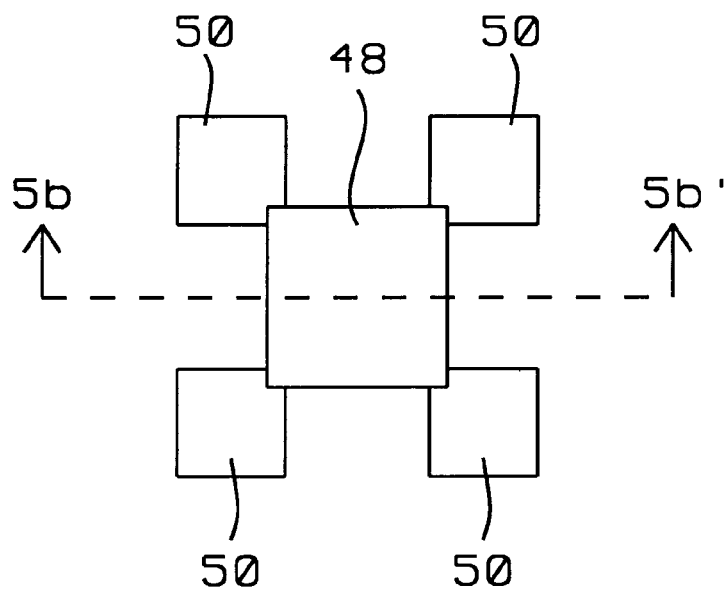
FIGS. 5a and 5b show further detail of the ball inspection operation or nest.
Figure 5B:
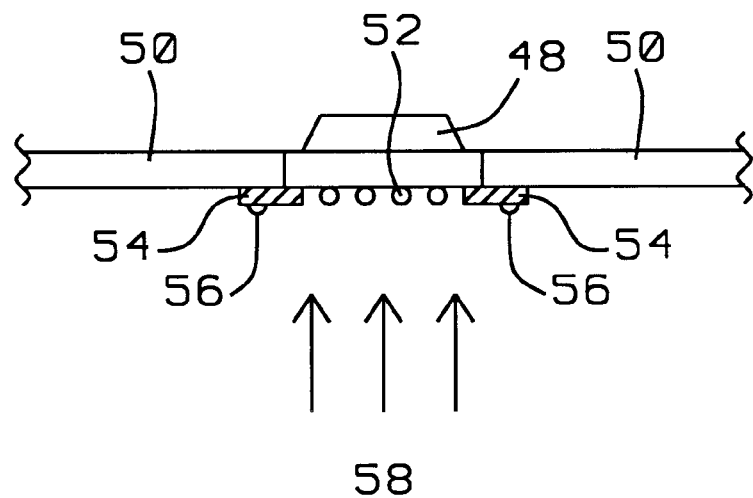

FIG. 5 shows a top view (FIG. 5a) and a cross section (FIG. 5b) of the ball coplanarity inspection nest 50. The BGA die 48 is positioned on four support pedestals 50 (e.g. nest) which provide a firm and fixed platform on which the BGA die rests during the inspection of the die coplanarity. It is clear that the support platform that is formed by the four pedestals must provide a well aligned interface medium with the surface of all four platforms being contained in one plane. Any deviation from the planarity of the support platforms will has a severe negative effect on the results that are obtained during the coplanarity evaluation of device 48 since such a deviation makes the critical measurements of distance between the contact points of the contact balls and an underlying reference plane invalid.

FIG. 5b shows a cross section of the BGA type device after this device has been inserted in the corresponding device nest for evaluation of the coplanarity of its contact balls. This cross section of FIG. 5b is taken along the line 5b–5b' of FIG. 5a. Cut-outs have been provided in each of the corners of platforms 50 such that device 48 rests on and makes close contact with the platform supports 56 that are attached to platforms 50 by means of screws 56. A optical camera or image 58 is used to measure the contact ball coplanarity, all the balls that form the contact ball array of the BGA device 48 can in this manner be observed simultaneously.

FIG. 6 gives a cross section of the optical arrangement that is used to perform the coplanarity measurement of the BGA device 48. A (standard) light source 62 is positioned to illuminate the object 63 which may be a reference pad that has been provided for this purpose in the surface of a plane that further contains a multiplicity of contact balls. The light source 62 emits an illumination beam 64 which focuses at point 66, which is the point where the beam 64 impacts the reference object 63. Good depth of focus that is provided to the light beam 64 assures that the point 66 is in sharp focus and does not vary significantly with any potential variation of the height of the reference object 63. The reflected beam 67 is shaped with optics 68 and further processed with the light sensor 70. Light sensor 70 can be one of the well known light sensors that are used in the art such as Coupled Charge Devices (CCD's) or Position Sensitive Devices (PSD's). Image height can in this manner be determined since the image location that is observed by observing the reflected beam 67 is related to the location of the spot 66 and the reference object 63. Once this image height has been determined in this manner, this measurement is further forwarded via connection 71 to and processed by calibrated electronics 72, which calculates the actual height of the reference object 63. This process can be performed for a number of reference points that have been provided for this purpose whereby the various reference points are identified by their x-y location. Scanning across the surface wherein these reference points reside will results in creating a map that reflects actual height across the surface as a function of the x-y coordinates that are valid within the surface.

It is clear that the method that is used for determining contact ball coplanarity can encounter a number of problems such as lack of reflectivity of the surface of the reference point 63 or light diffusion of the light beam 67 that is reflected by the reference point 63. It is also clear that the application of reference points, their type and distribution across a surface and the therewith associated statistical calculation of the planarity of the plane that is being measured all form methods and techniques that can be complex and therefore sophisticated from both a mathematical point of view and from a process control and board design point of view. These various disciplines however are not part of this invention and will therefore not be further discussed at this point.

Figure 7:
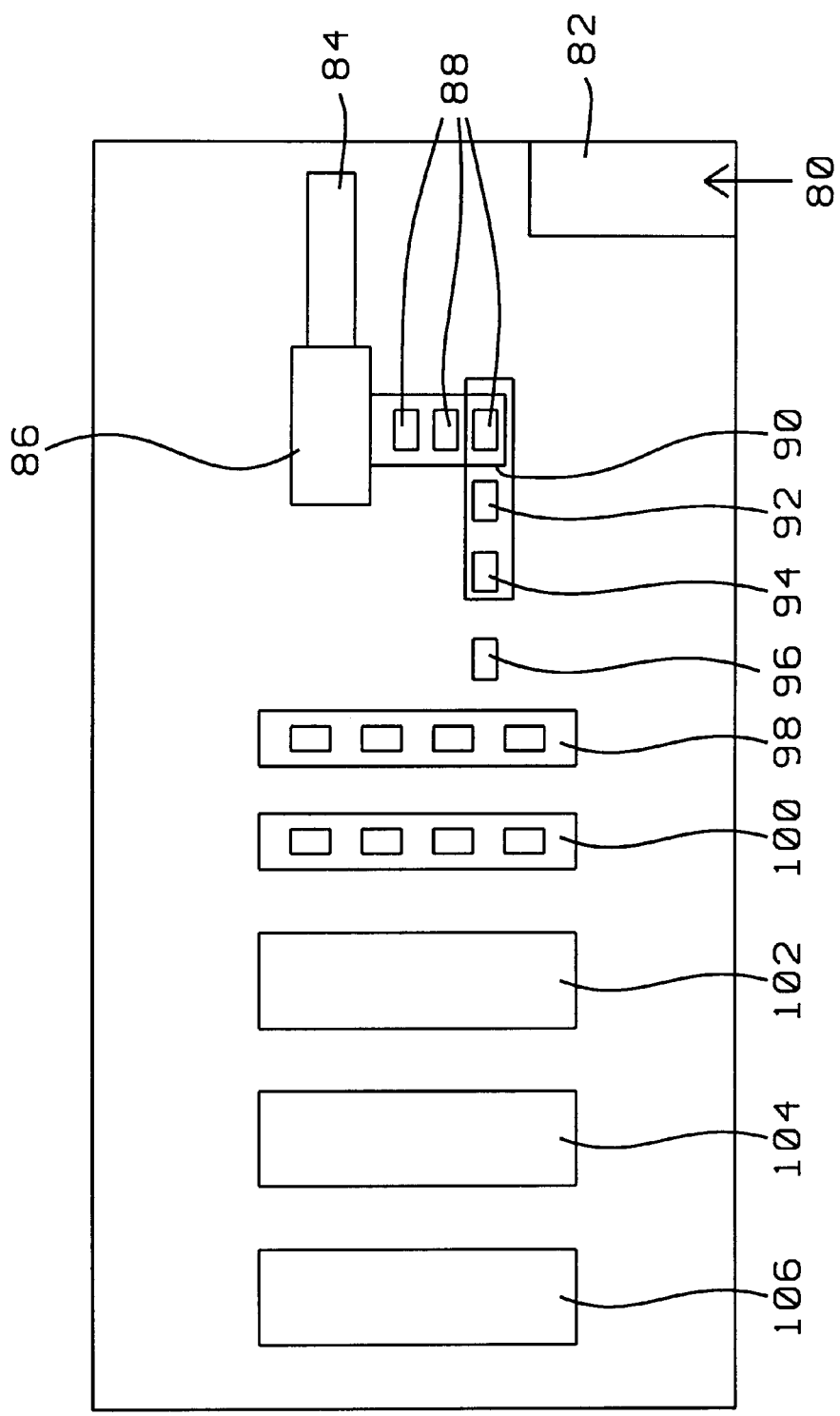
FIG. 7 shows an overview of the current processing sequence.

FIG. 7 shows an overview of the processing sequence that applies the process of the invention. Substrate 18 (FIG. 2) enters the operational cycle at entry point 80 and is held in the input buffer 82. The substrate rail 84 is advanced to the cutting tool 86 from where the singulated units 88 emerge. The pick-and-place operation 90 consists of an orientation inspection 92 and a marking inspection 94. The ball inspection 96 is the ball inspection as has been highlighted in FIGS. 5a and 5b thereby including and of critical importance to the process of the invention the coplanarity inspection. After this latter inspection, the singulated units are placed in good trays 98 or reject trays 100, these individual trays are combined into larger good tray assemblies 102 and larger reject tray assemblies 104 after which all trays enter the buffer station 106. The two operations 100 and 102 form the sorting operations. The process of the invention therefore includes the coplanarity inspection to the ball inspection tool, in Prior Art processes the coplanarity tool was a separate tool.

The details that have been highlighted above that describe the process of the invention indicate an improved method of evaluating contact ball coplanarity, a method the further lends itself to integration within a processing environment and to automatic control of results that are obtained. This increased automation is one additional step in improved process control and in reducing the (error prone) need for human intervention of the process of creating BGA type devices.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for inspecting the coplanarity of substrates for ball grid array, column grid array and similar surface mount integrated circuit chips, using 3-D optical sensing means, comprising the steps of:

providing a substrate strip that is used for mounting of said ball grid array, column grid array and similar surface mount integrated circuit chips;

attaching said ball grid array, column grid array or similar surface mount integrated circuit chips to said substrate strip;

wire bonding said ball grid array, column grid array or similar surface mount integrated circuit chips to metal traces that are contained in said substrate strip;

encapsulation of said ball grid array, column grid array or similar surface mount integrated circuit chips in a protective molding;

marking said ball grid array, column grid array or similar surface mount integrated circuit chips for production control purposes;

attaching of contact balls to said ball grid array, column grid array or similar surface mount integrated circuit chips;

singulating said ball grid array, column grid array or similar surface mount integrated circuit chips by separating said substrate into individual substrates;

transporting said individual substrates through a buffer zone; and measuring ball coplanarity for each of said individual substrates.

2. The method of claim 1 wherein said processes of singulation of ball grid array, column grid array or similar surface mount integrated circuit chips and measuring ball coplanarity of said individual substrates are performed using one tool.

3. The method of claim 1 with the additional step of sorting said individual substrates into different classes based on results obtained during said measuring ball coplanarity for each of said individual substrates.

4. The method of claim 1 wherein said measuring ball coplanarity for each of said individual substrates comprises placing said individual substrates into substrate containers or nests that support and contain said individual substrates during said process of measuring ball coplanarity whereby said nests are further constructed such that points of contact of said ball grid array, column grid array and similar surface mount integrated circuit chips are clearly visible and accessible for optical measurement.

5. The method of claim 4 wherein said substrate containers or nests support said ball grid array, column grid array and similar surface mount integrated circuit chips during said process of measuring ball coplanarity for each of said individual substrates in a consistent and repetitive manner such that coplanarity can be measured and compared for a succession of individual substrates and a clear and dependable correlation can be established between measurements of coplanarity of all substrates for which coplanarity is measured in this manner.

6. The method of claim 5 wherein said support for said ball grid array, column grid array and similar surface mount integrated circuit chips during said process of measuring ball coplanarity for each of said individual substrates comprises a set of four support platforms having top surfaces that are evenly distributed around the perimeter of said ball grid array, column grid array and similar surface mount integrated circuit chips whereby one platform is allocated per corner of said ball grid array, column grid array and similar surface mount integrated circuit chip whereby further said top surfaces of said four support platforms are located in one plane.

7. The method of claim 1 whereby said buffer zone comprises one or more of said individual substrates containing said ball grid array, column grid array or similar surface mount integrated circuit chips whereby further said individual substrates are entered into and exited from said buffer zone by employing methods of pick-and-place.

8. An apparatus for inspecting the coplanarity of substrates for ball grid array, column grid array and similar surface mount integrated circuit chips, using 3-D optical sensing means, comprising:

a means for singulating said ball grid array, column grid array or similar surface mount integrated circuit chips by separating said substrate into individual substrates;

a means for orientation of said individual substrates;

a means for marking inspection of said individual substrates; and a means for performing ball inspection thereby including measuring ball coplanarity.

9. The apparatus of claim 8 with the addition of providing a means for transporting said individual substrates through a buffer zone.

10. The apparatus of claim 8 with additionally providing a means for sorting said individual substrates into different classes based on results obtained during said measuring ball coplanarity for each of said individual substrates.

11. The apparatus of claim 8 wherein said means for measuring ball coplanarity for each of said individual substrates comprises a means for placing said individual substrates into substrate containers or nests that support and contain said individual substrates during said process of measuring ball coplanarity whereby said nests are further constructed such that points of contact of said ball grid array, column grid array and similar surface mount integrated circuit chips are clearly visible and accessible for optical measurement.

12. The apparatus of claim 11 wherein said substrate containers or nests support said ball grid array, column grid array and similar surface mount integrated circuit chips during said process of measuring ball coplanarity for each of said individual substrates in a consistent and repetitive manner such that coplanarity can be measured and compared for a succession of individual substrates and a clear and dependable correlation can be established between measurements of coplanarity of all substrates for which coplanarity is measured in this manner.

13. The apparatus of claim 12 wherein said support for said ball grid array, column grid array and similar surface mount integrated circuit chips during said process of measuring ball coplanarity for each of said individual substrates comprises a set of four support platforms having top surfaces that are evenly distributed around the perimeter of said ball grid array, column grid array and similar surface mount integrated circuit chips whereby one platform is allocated per corner of said ball grid array, column grid array and similar surface mount integrated circuit chip whereby further said top surfaces of said four support platforms are located in one plane.

14. The apparatus of claim 8 whereby said buffer zone comprises one or more of said individual substrates containing said ball grid array, column grid array or similar surface mount integrated circuit chips whereby further said individual substrates are entered into and exited from said buffer zone by employing methods of pick-and-place.

* * * * *